(12) United States Patent
Lee

(10) Patent No.: US 6,975,020 B2
(45) Date of Patent: Dec. 13, 2005

(54) SEMICONDUCTOR INTEGRATED CIRCUIT HAVING PADS LAYOUT FOR INCREASING SIGNAL INTEGRITY AND REDUCING CHIP SIZE

(75) Inventor: Ho-Cheol Lee, Yongin (KR)

(73) Assignee: Samsung Electronics Co., Ltd., Kyunggi-do (KR)

( * ) Notice: Subject to any disclaimer, the term of this patent is extended or adjusted under 35 U.S.C. 154(b) by 22 days.

(21) Appl. No.: 10/750,942

(22) Filed: Jan. 5, 2004

(65) Prior Publication Data

US 2004/0164422 A1 Aug. 26, 2004

(30) Foreign Application Priority Data

Feb. 25, 2003 (KR) .................. 10-2003-0011686

(51) Int. Cl.[7] ...................... H01L 23/495; H01L 23/48; H01L 23/52
(52) U.S. Cl. ................. 257/666; 257/672; 257/692; 257/695; 257/735
(58) Field of Search ................. 257/666, 672, 257/692, 695, 732, 730, 735, 773, 776, 784

(56) References Cited

U.S. PATENT DOCUMENTS

| | | | | |
|---|---|---|---|---|
| 5,446,317 A | * | 8/1995 | Sato et al. | ................. 257/734 |
| 5,962,926 A | * | 10/1999 | Torres et al. | ................. 257/786 |
| 6,121,681 A | * | 9/2000 | Tanaka et al. | ............... 257/723 |
| 6,291,898 B1 | * | 9/2001 | Yeh et al. | .................... 257/786 |
| 6,323,545 B1 | * | 11/2001 | Michii | ........................ 257/678 |
| 6,433,421 B2 | | 8/2002 | Tamaki et al. | |
| 6,469,327 B1 | * | 10/2002 | Yasuda et al. | ............... 257/207 |
| 6,476,467 B2 | * | 11/2002 | Nakamura et al. | .......... 257/668 |
| 6,492,667 B2 | * | 12/2002 | Kamiya | ...................... 257/208 |

* cited by examiner

*Primary Examiner*—Jerome Jackson
*Assistant Examiner*—Jesse A. Fenty
(74) *Attorney, Agent, or Firm*—Harness, Dickey & Pierce, PLC

(57) ABSTRACT

A semiconductor integrated circuit device includes a semiconductor chip having a memory cell array region surrounded with a peripheral circuit region and includes a plurality of bonding pads disposed at least in one row on only one side of the semiconductor chip. The circuit device may include first leads group disposed adjacent to the bonding pad side and a second leads group disposed opposite the first leads group. The second leads group may be formed over a portion of the semiconductor chip (lead-on-chip structure). A plurality of bonding wires connect the first and second leads group with the plurality of bonding pads respectively.

16 Claims, 5 Drawing Sheets

SEMICONDUCTOR INTEGRATED CIRCUIT HAVING PADS LAYOUT FOR INCREASING SIGNAL INTEGRITY AND REDUCING CHIP SIZE

This U.S. nonprovisional patent application claims priority under 35 U.S.C. §119 of Korean Patent Application 2003-11686 filed on Feb. 25, 2003, the entire contents of which is hereby incorporated by reference.

FIELD OF THE INVENTION

The present invention relates to a semiconductor integrated circuit device, and more particularly to a pad layout and a wire bonding in a semiconductor integrated circuit device, such as a semiconductor memory device etc.

DESCRIPTION OF THE RELATED ART

A semiconductor integrated circuit, such as a semiconductor memory device generally has bonding pads on an upper surface of a chip to allow for an external electrical connection with another chip. Electrical signals, such as command input signals, data read and data write operation signals are input or output the chip through the bonding pads.

Even though a degree of integration for elements mounted in the semiconductor chip may be increased, e.g., doubled, the number of bonding pads may not be increased by much. An area occupied by the bonding pads may be not so important in a high integration degree memory device etc., but may be a more important factor in a low integration degree memory device. As a result, fabrication processes have been improved to reduce chip size, while, the actual size of bonding pads has not been reduced. That is, even if the size of a chip may be reduced, a size of the bonding pads may not be easily reduced because of problems such as reinvestment in bonding equipment and test equipment using the bonding pads. Therefore, the area occupied by the bonding pads in the chip has tended to increase.

FIG. 1 is a plan view illustrating the exterior of a semiconductor integrated circuit device 100 having a general structure of pads with a center layout. Referring to FIG. 1, bonding pads PD1,PD2~PDn are disposed in one row between memory cell array regions 10, 20. A place where the bonding pads PD1,PD2~PDn are located becomes an upper part of a peripheral circuit region 30. Such a layout of the bonding pads is called a pads center layout system. Wire bonding for pads with the pads center layout structure may be performed over upper parts of the memory cell array region 10 and the memory cell array region 20 on chip 100. In other words, part of the leads from a lead frame may be disposed close to the memory cell array region 10, and the remaining leads may be disposed close to the memory cell array region 20. Wires connecting between each of the leads and each of the pads may be formed over an upper part of the memory cell array regions 10, 20 thus undergo a bonding operation. The pads center layout structure has a shortcoming in that cell array regions are separated from each other because the pads PD1~PDn are disposed between the memory cell array regions 10, 20, and this detrimentally influences signal integrity.

FIGS. 2a and 2b are plan views showing the exterior of a semiconductor integrated circuit device having a general structure of an edge pad layout system. FIG. 2a illustrates a layout of bonding pads PD1~PDn, PDa1~PDan disposed in parallel only on two sides of the chip 100. While, FIG. 2b illustrates a layout of bonding pads disposed on all four sides of the chip 100. In wire bonding pads of an edge pad layout system, there may be no wire formed over an upper part of a memory cell array region 11, but a reduction of the chip size may be difficult to realize because the pads are disposed on several sides of the chip 100. Also, signal integrity may be reduced by the dispersed layout of the bonding pads.

Accordingly, a desire exists in the industry to dispose bonding pads more efficiently to reduce a chip size and increase signal integrity.

SUMMARY OF THE INVENTION

Exemplary embodiments of the present invention provide a semiconductor integrated circuit device having a bonding pads layout structure capable of increasing signal integrity and reducing a chip size.

Exemplary embodiments of the present invention provide a semiconductor integrated circuit device including a semiconductor chip having a memory cell region and a peripheral region, and a plurality of bonding pads disposed on only one side of the semiconductor chip.

In an exemplary embodiment, a plurality of bonding pads may be disposed in at least one row on one side of a semiconductor chip.

In another exemplary embodiment, a plurality of bonding pads may be disposed in two rows on one side of a semiconductor chip.

In another exemplary embodiment, a semiconductor integrated device includes a plurality of bonding pads disposed in one row on one side of a chip, a first leads group disposed to the bonding pad side of the chip and a second leads group disposed opposite the first leads group. A plurality of bonding wires electrically connect the two leads group with the bonding pads respectively.

In another exemplary embodiment, a semiconductor integrated device includes a plurality of bonding pads disposed in two rows on one side of a chip, a first leads group disposed to the bonding pad side of the chip and a second leads group disposed opposite the first leads group. A plurality of bonding wires electrically connect the two leads group with the bonding pads respectively.

In another exemplary embodiment, a semiconductor integrated device includes a plurality of bonding pads disposed in one row on one side of a chip, a first leads group disposed to the bonding pad side of the chip and a second leads group formed over a portion of the semiconductor chip. A plurality of bonding wires electrically connect the two leads group with the bonding pads respectively.

In another exemplary embodiment, a semiconductor integrated device includes a plurality of bonding pads disposed in two rows on one side of a chip, a first leads group disposed to the bonding pad side of the chip and a second leads group formed over a portion of the semiconductor chip. A plurality of bonding wires electrically connect the two leads group with the bonding pads respectively.

The pad layout structure of the semiconductor integrated circuit device may increase a signal integrity for signals input and output through circuits of a peripheral circuit region, by using a pads layout on only one side of the chip, and may reduce a chip size by using a concentrated layout of bonding pads and circuit elements constituting the peripheral circuit region on only one side of the chip.

BRIEF DESCRIPTION OF THE DRAWINGS

The above and other features of the present invention will become readily apparent from the description of exemplary embodiments that follows with reference to the accompanying drawings, in which like reference numerals and symbols designate like elements, in which.

DETAILED DESCRIPTION OF EXEMPLARY EMBODIMENTS OF THE INVENTION

The present invention and exemplary embodiments thereof are more fully described below with reference to the accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

According to exemplary embodiments of the present invention, a semiconductor integrated circuit device having one-side layout structure of bonding pads is provided.

Figure 1:
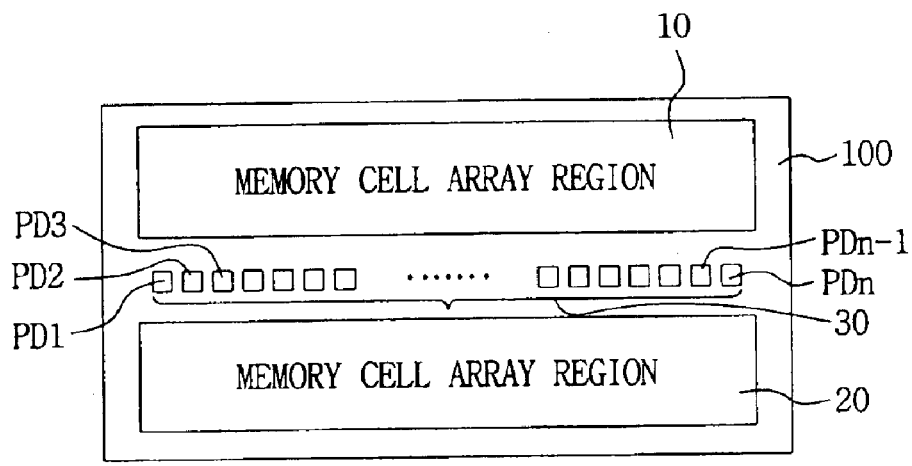
FIG. 1 is a plan view illustrating the exterior of a semiconductor integrated circuit device having a conventional structure of pads center layout.
Figure 2A:
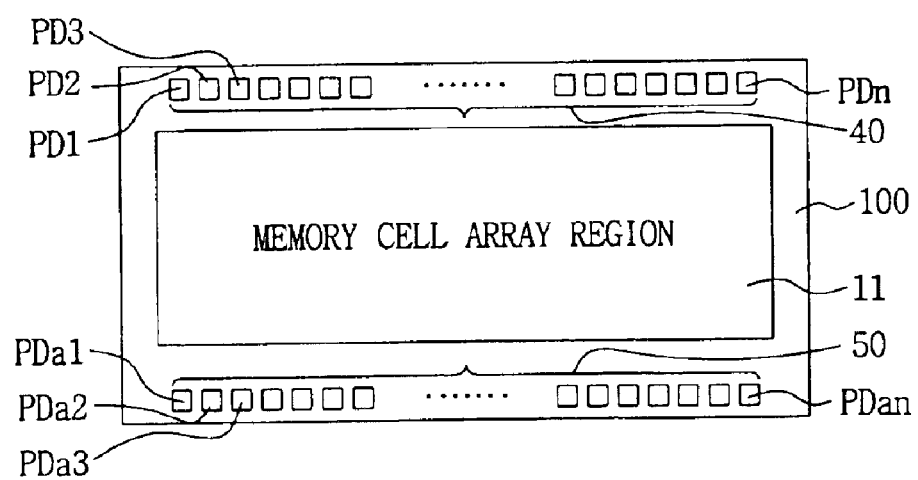
FIGS. 2a and 2b are plan views illustrating the exterior of a semiconductor integrated circuit device having a conventional structure of an edge pad layout system.
Figure 2B:
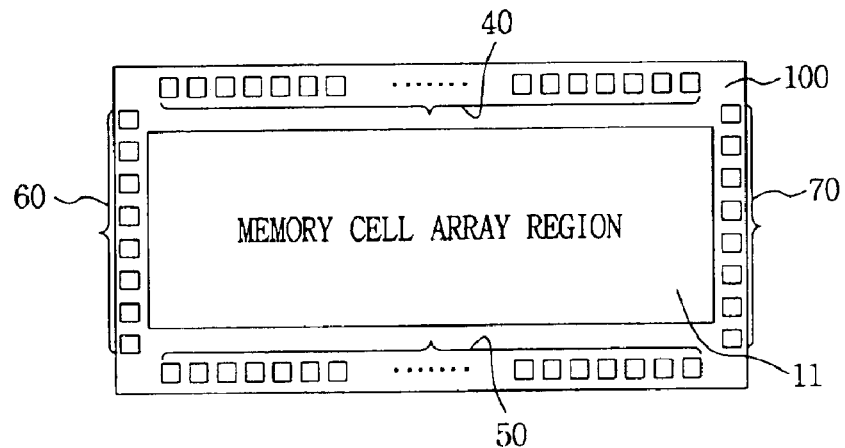
Figure 3:
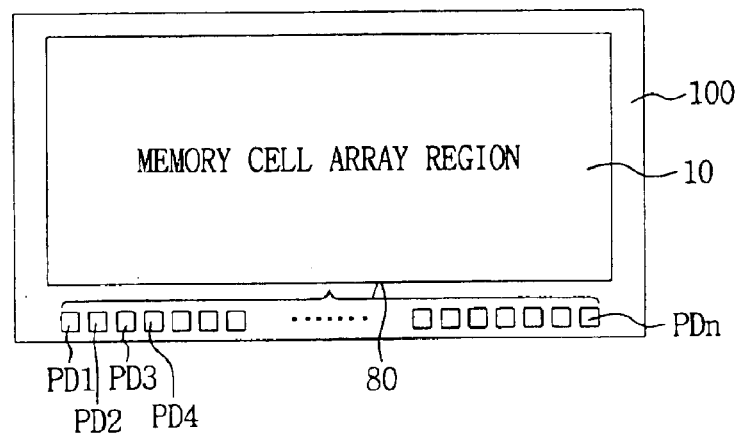
FIG. 3 is a plan view showing the exterior of a semiconductor integrated circuit device having one side pad layout according to an exemplary embodiment of the present invention.

FIG. 3 is a plan view illustrating the exterior of a semiconductor integrated circuit device having a one side pad layout structure according to an exemplary embodiment of the present invention. Referring to FIG. 3, the semiconductor integrated circuit device includes a semiconductor chip 100, and the semiconductor chip 100 has a memory cell array region 10 surrounded with peripheral circuit regions. A plurality of bonding pads PD1~PDn are disposed only on one side of the semiconductor chip 100 in the region 80 among the peripheral circuit regions. Though the drawing shows that the plurality of bonding pads PD1~PDn are disposed on one side of the chip 100 where the peripheral circuit region 80 is located, the bonding pads may instead be disposed on one of the other three sides of the chip 100.

Figure 4:
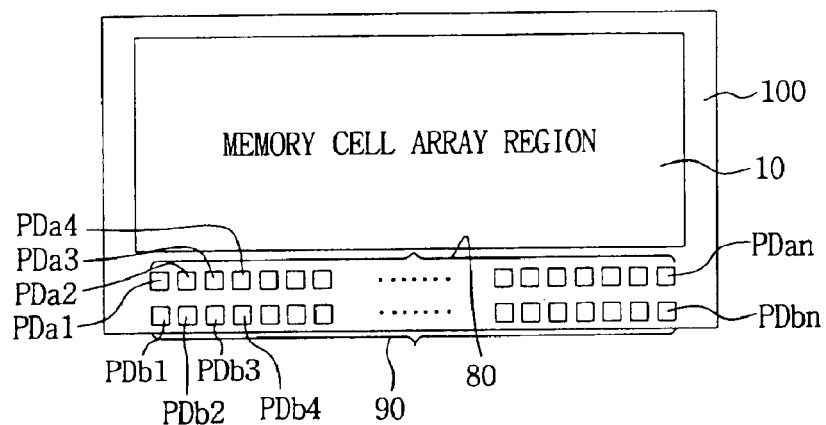
FIG. 4 is a plan view showing the exterior of a semiconductor integrated circuit device having one-side dual pad layout structure according to an exemplary embodiment of the present invention.

FIG. 4 is a plan view showing the exterior of a semiconductor integrated circuit device having a one-side dual pad layout structure according to an exemplary embodiment of the present invention. Referring to FIG. 4, the bonding pads are disposed in more than one row, as compared to the layout structure of FIG. 3. The layout structure of FIG. 4 indicates the plurality of bonding pads PDa1~PDan, PDb1~PDbn disposed in two rows on one side of the chip 100.

Figure 5:
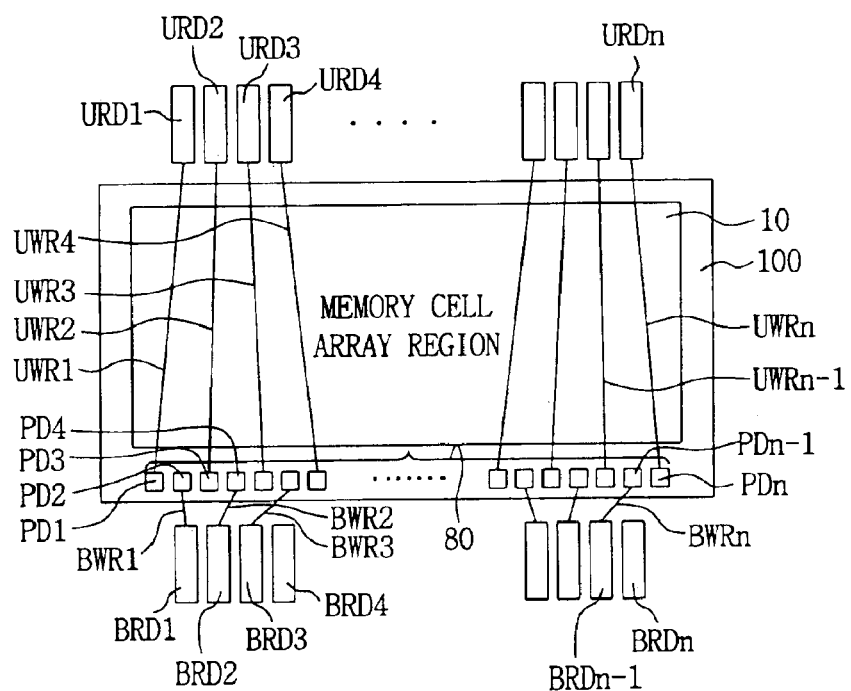
FIGS. 5 and 6 are plan views showing the exterior of a semiconductor integrated circuit device with a wire bonding corresponding to each pad layout of FIGS. 3 and 4.
Figure 6:
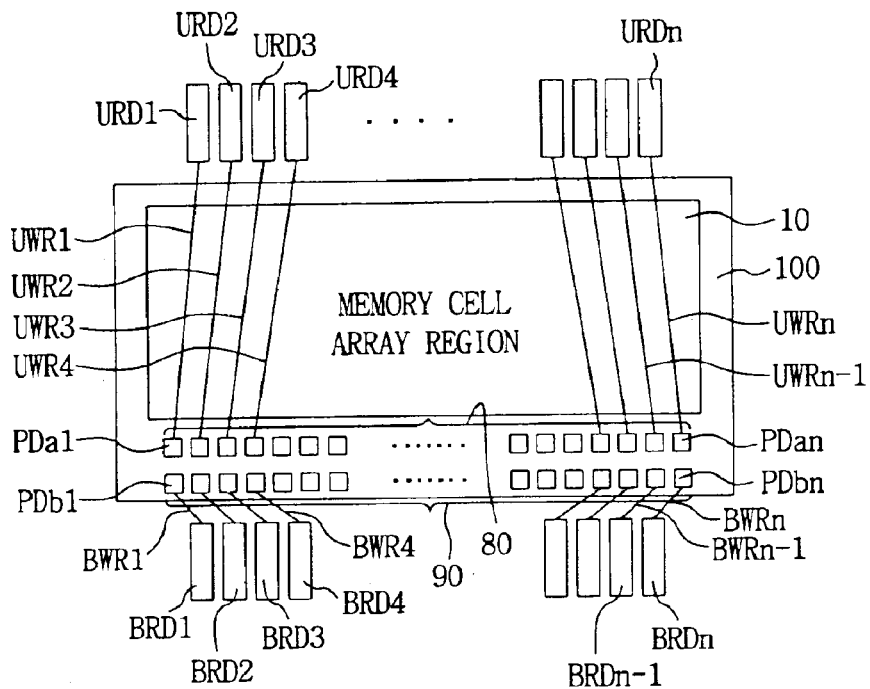

FIGS. 5 and 6 are plan views illustrating the exterior of a semiconductor integrated circuit device with wire bonding corresponding to a layout of pads shown in FIGS. 3 and 4. Referring first to FIG. 5, in one side bonding pad layout referred to FIG. 3, first leads group BRD1~BRDn drawn from a lead frame are disposed adjacently to the one side of the semiconductor chip 100. Thus, wire bonding of a first group of wires BWR1~BWRn for correspondingly connecting the pads PD2,PD4~PDn-1 of the plurality of bonding pads PD1~PDn with the first leads group BRD1~BRDn is performed over an upper part of the peripheral circuit region 80. That is, the wire bonding of the first group wires BWR1~BWRn is not performed over an upper part of the memory cell array region 10.

The second group leads URD1~URDn drawn from the lead frame are disposed adjacently a side opposing the side with the bonding pads PD1~PDn. Thus, wire bonding of a second group of wires UWR1~UWRn for correspondingly connecting the remaining bonding pads PD1,PD3~PDn of the plurality of bonding pads PD1~PDn with the second group leads URD1~URDn is performed over an upper part of the memory cell array region 10.

With reference to FIG. 6, a wire bonding relationship in a one-side two-rows bonding pad layout shown in FIG. 4 is illustrated. The bonding pads adjacent to one another in the one-side one-line layout of the semiconductor chip as shown in FIG. 3, are wire-bonded alternately with the first and second group leads BRD1~BRDn, URD1~URDn as shown in FIG. 5. In case of the bonding pads disposed in two rows on one side of the semiconductor chip as shown in FIG. 4, the bonding pads PDa1~PDan of the first row and the bonding pads PDb1~PDbn of the second row are wire-bonded to the first and second group leads BRD1~BRDn and URD1~URDn, respectively as shown in FIG. 6.

Consequently, a chip size may be reduced because the bonding pads are disposed on one side of the chip 100, and signal integrity for signals input and output through circuits provided within the peripheral circuit region is increased because of the concentrated layout of the bonding pads.

Figure 7:
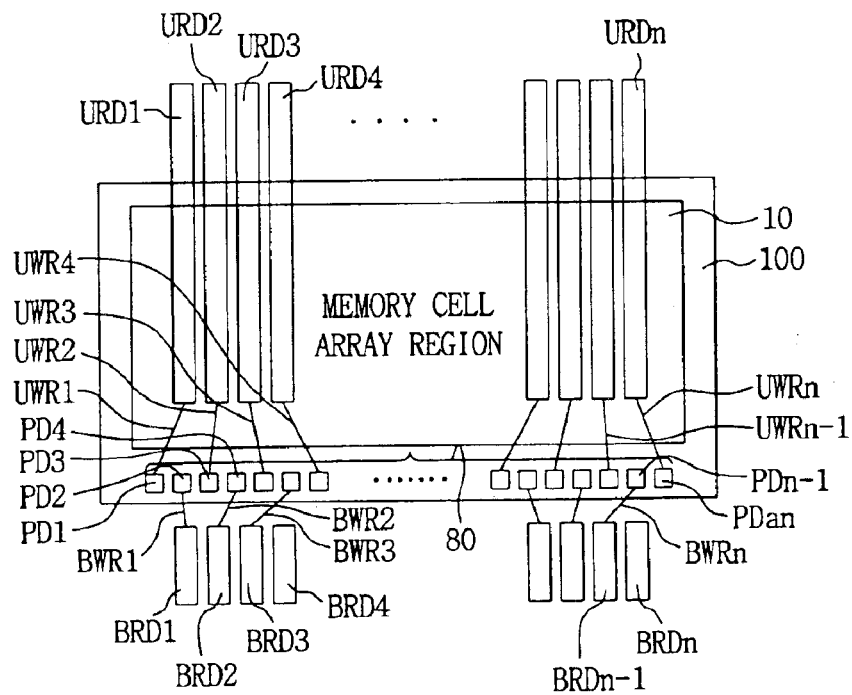
FIGS. 7 and 8 are plan views illustrating the exterior of a semiconductor integrated circuit device with a wire bonding provided on a lead on chip(LOC) structure according to exemplary embodiments varied from FIGS. 5 and 6.
Figure 8:
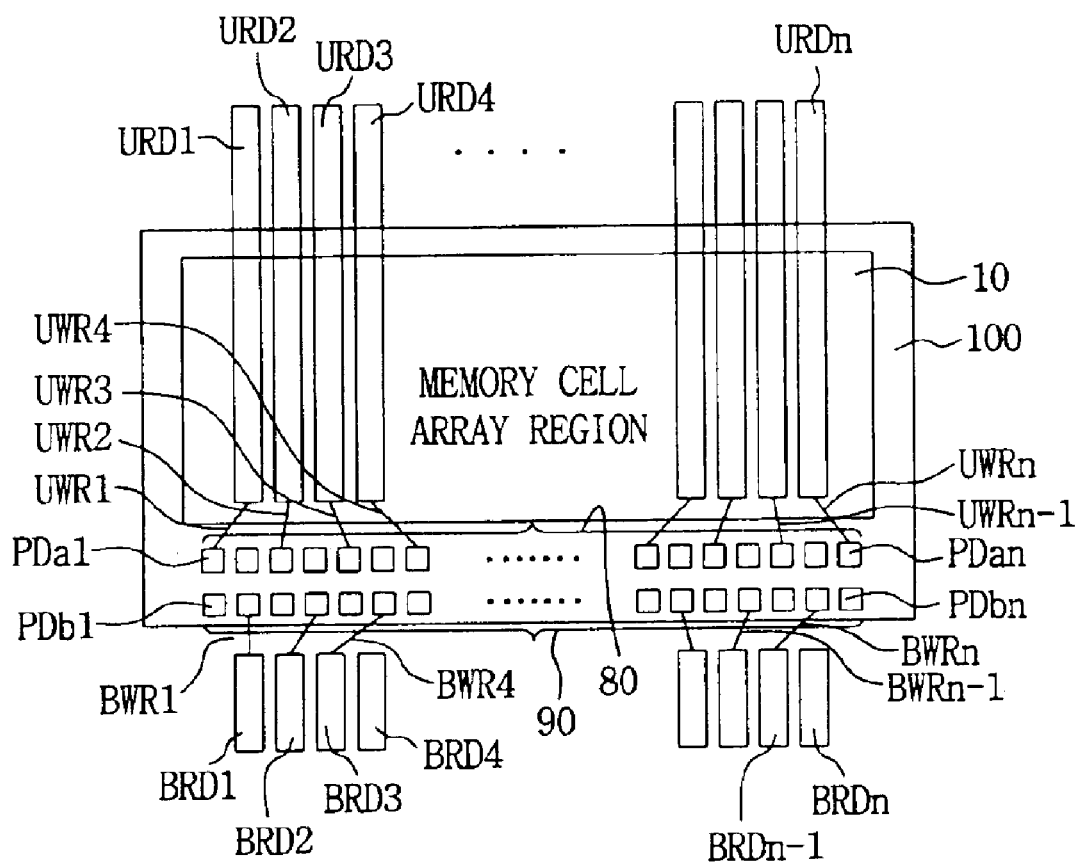

FIGS. 7 and 8 are plan views illustrating the exterior of a semiconductor integrated circuit device having a LOC (Lead-On-Chip) structure according to an exemplary embodiments varied from FIGS. 5 and 6 respectively. Such a layout may be more advantageously applicable to the LOC structure.

The bonding wire and lead arrangement of FIG. 7 is the same as the arrangement of FIG. 5, except that the second group leads URD1~URDn extend over the chip 100 consistent with on a LOC structure. In this structure, the wire bonding between the second group leads URD1~URDn and the bonding pads is performed over a portion of the memory cell array region 10 closest to the bonding pads. Such a wire bonding arrangement substantially reduces a length of wires UWR1~UWRn as compared with FIG. 5.

The bonding wire and lead arrangement of FIG. 8 is the same as the arrangement of FIG. 6, except that the second group leads URD1~URDn extend over the chip 100 consistent with a LOC structure. Here, a length of the bonding wires UWR1~UWRn is also substantially reduced as compared with FIG. 6.

In FIGS. 7 and 8, the bonding pads are disposed in one or two rows on one side of the chip 100, thus a chip size is reduced and signal integrity for signals input and output through circuits provided within the peripheral circuit region is increased because of a concentrated layout of the bonding pads.

As described above, a pads layout structure of a semiconductor integrated circuit device increases signal integrity for signals input and output through circuits provided within a peripheral circuit region by a one-side pad layout of a chip.

Additionally, a concentrated layout of the bonding pads and circuit elements constituting the peripheral circuit region on only one side of a chip reduces a chip size.

While the present invention has been particularly shown and described with reference to the exemplary embodiments described above, it will be understood by those skilled in the art that these exemplary embodiments do not limit the scope of the present invention. For instance, a shape or array relationship of pads may be varied. Thus, various changes in form and details may be made without departing from the spirit and scope of the invention as defined by the appended claims.

What is claimed is:

1. A semiconductor integrated circuit device, comprising:
   a semiconductor chip having a memory cell array region and a peripheral circuit region surrounding the memory cell array region;
   a plurality of bonding pads disposed on only one side of the semiconductor chip on the peripheral circuit region; and
   a plurality of leads formed on a side of the semiconductor chip opposite the side on which the bonding pads are disposed for connection with the bonding pads.

2. The device of claim 1, wherein the plurality of bonding pads are disposed in at least one row.

3. The device of claim 2, wherein the plurality of bonding pads are disposed in two rows.

4. The device of claim 1, further comprising:
   a plurality of bonding wires electrically connecting the plurality of leads, respectively, with a portion of the bonding pads so as to cross the memory cell array region.

5. A semiconductor integrated circuit device, comprising:
   a semiconductor chip having a memory cell array region and a peripheral circuit region surrounding the memory cell array region;
   a plurality of bonding pads disposed in at least one row on only one side of the semiconductor chip on the peripheral circuit region;
   a first leads group disposed adjacent to the bonding pad side of the semiconductor chip;
   a second leads group disposed opposite the first leads group; and
   a plurality of bonding wires having a first plurality of bonding wires and a second plurality of bonding wires electrically connecting the first leads group and the second leads group, respectively, with the plurality of bonding pads.

6. The device of claim 5, wherein the second leads group disposed opposite the first leads group are located to a side of the semiconductor chip opposite the bonding pad side.

7. The device of claim 5, wherein the plurality of bonding pads are electrically connected alternately with the first leads group and the second leads group by the first plurality of bonding wires and the second plurality of bonding wires, respectively, the first plurality of bonding wires being disposed over the peripheral circuit region, the second plurality of bonding wires being disposed over the memory cell array region.

8. The device of claim 5, wherein the plurality of bonding pads are disposed in a first row and a second row, the first row of bonding pads and the second row of bonding pads being electrically connected to the first leads group and the second leads group, respectively, by the first plurality of bonding wires and the second plurality of bonding wires, the first plurality of bonding wires being disposed over the peripheral circuit region, and the second plurality of bonding wires being disposed over the memory cell array region.

9. The device of claim 5, wherein the second leads group extends over a portion of the semiconductor chip region.

10. The device of claim 9, wherein the plurality of bonding pads are electrically connected alternately with the first leads group and the second leads group by the first plurality of bonding wires and the second plurality of bonding wires, respectively, the first plurality of bonding wires being disposed over the peripheral circuit region, the second plurality of bonding wires being disposed over the memory cell array region.

11. The device of claim 9, wherein the plurality of bonding pads are disposed in a first row and a second row, the first row of bonding pads and a second row of bonding pads being electrically connected to the first leads group and the second leads group, respectively, by the first plurality of bonding wires and the second plurality of bonding wires, the first plurality of bonding wires being disposed over the peripheral circuit region, and the second plurality of bonding wires being disposed over the memory cell array region.

12. A semiconductor integrated circuit device, comprising:
    a semiconductor chip having a memory cell array region;
    a plurality of bonding pads disposed on only one side of the semiconductor chip; and
    a plurality of leads formed on a side of the semiconductor chip opposite the one side on which the bonding pads are disposed for connection with the bonding pads.

13. The device of claim 12, further comprising:
    a plurality of bonding wires electrically connecting the plurality of leads to corresponding bonding pads disposed on the one side so as to cross the memory cell array region.

14. The device of claim 12, wherein the plurality of bonding pads are disposed in at least one row.

15. The device of claim 14, wherein the plurality of bonding pads are disposed in two rows.

16. The device of claim 12, wherein
    the semiconductor chip includes a peripheral circuit region surrounding the memory cell array region, and
    the bonding pads are disposed on the one side of the semiconductor chip on the peripheral circuit region.

* * * * *